United States Patent
Ewald et al.

(10) Patent No.: US 12,323,075 B2
(45) Date of Patent: Jun. 3, 2025

(54) INVERTER STRUCTURE OF AN ELECTRONIC MODULE FOR AN ELECTRIC DRIVE OF A VEHICLE

(71) Applicant: ZF Friedrichshafen AG, Friedrichshafen, DE (US)

(72) Inventors: Ake Ewald, Bayreuth (DE); Stefan Hain, Speichersdorf (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 202 days.

(21) Appl. No.: 17/959,106

(22) Filed: Oct. 3, 2022

(65) Prior Publication Data
US 2023/0110879 A1   Apr. 13, 2023

(30) Foreign Application Priority Data
Oct. 11, 2021 (DE) ...................... 10 2021 211 409.1

(51) Int. Cl.
*H02M 7/5387* (2007.01)
*B60L 50/51* (2019.01)
*H05K 7/20* (2006.01)

(52) U.S. Cl.
CPC ........... *H02M 7/5387* (2013.01); *B60L 50/51* (2019.02); *H05K 7/209* (2013.01); *B60L 2210/40* (2013.01)

(58) Field of Classification Search
CPC .... H02M 7/5387; H02M 7/003; H05K 7/209; B60L 50/51; B60L 2210/40
See application file for complete search history.

(56) References Cited

U.S. PATENT DOCUMENTS

| | | | | |
|---|---|---|---|---|
| 2004/0113268 A1* | 6/2004 | Shirakawa | ............ | H02M 7/003 257/E23.173 |
| 2011/0051371 A1* | 3/2011 | Azuma | ................ | B60W 10/08 361/699 |
| 2014/0334203 A1* | 11/2014 | Honda | .................. | H02M 7/537 363/56.12 |
| 2017/0079132 A1* | 3/2017 | Bayerer | ............... | H05K 1/0231 |
| 2017/0197730 A1* | 7/2017 | Lutze | ..................... | H02P 27/06 |
| 2021/0399667 A1* | 12/2021 | Liu | ......................... | B60L 50/51 |
| 2022/0201903 A1* | 6/2022 | Ewald | .................... | H05K 7/209 |

FOREIGN PATENT DOCUMENTS

| | | | | |
|---|---|---|---|---|
| DE | 102015115271 A1 * | 3/2017 | ........... | H01L 23/642 |
| DE | 102020213972 A1 * | 5/2022 | | |
| WO | WO-02082543 A1 * | 10/2002 | ........ | H01L 23/5383 |
| WO | WO-2013114565 A1 * | 8/2013 | ........... | H01L 23/642 |
| WO | WO-2019158390 A1 * | 8/2019 | ........... | H02M 7/003 |

* cited by examiner

*Primary Examiner* — Sisay G Tiku
(74) *Attorney, Agent, or Firm* — Crowell & Moring LLP

(57) ABSTRACT

An inverter has at least one current phase along a first axis and an input-side current connection for each phase, for receiving a DC input current. The phase(s) output AC output current generated from the DC input current, which is generated by a semiconductor bridge circuit. An intermediate circuit connected in parallel to the bridge circuit has at least one capacitor and heat sink between the intermediate circuit and the bridge circuit. The bridge circuit lies on the heat sink. The bridge circuit has at least one half bridge for each phase, formed by a high side switch and an opposing low side switch, connected in parallel, and each of the phases is located between the associated high and low side switches and on the heat sink, and each high and low side switch is electrically connected directly to the respective phase via a first electrical contact connection.

18 Claims, 2 Drawing Sheets

INVERTER STRUCTURE OF AN ELECTRONIC MODULE FOR AN ELECTRIC DRIVE OF A VEHICLE

CROSS-REFERENCE TO RELATED APPLICATION

This application claims priority to German Application No. DE 10 2021 211 409.1, filed on Oct. 11, 2021, the entirety of which is hereby fully incorporated by reference herein.

The present invention relates to the field of electromobility, in particular the electronic modules for an electric drive.

Electronic modules such as power electronics modules have been used with much greater frequency in motor vehicles in the last ten years. This is due to the necessities of fuel economy and vehicle performance as well as the advances in semiconductor technology. A prominent example of these electronic modules are DC/AC inverters, which are used to provide electric machines such as electric motors or generators with a multiphase alternating current. These convert a direct current generated by a DC power source such as a battery into a multiphase alternating current. The electronic modules have numerous electronic components for this which form bridge circuits (such as half bridges), e.g. semiconductor power switches, which can also be referred to as power semiconductors.

The linking of microelectronic and non-electronic microcomponents to obtain a complete system normally requires the use of so-called structural and connecting technologies in the case of electronic modules, in particular inverters. This is an extensive process, resulting in high costs for the production of inverters. In order to reduce production costs while still obtaining a sufficiently high power spectrum, framework modules are used that contain established semiconductor materials (e.g. silicon).

Not as many of these framework modules contain the newer semiconductors such as silicon carbide (SiC) or gallium nitride (GaN), which have a wide bandgap, as those that contain the established semiconductors. This results in a greater dependency on a small number of suppliers for these types of framework modules, such that there are supply chain shortages in some cases, or they are more expensive. In particular in the case of mass production, the use of these framework modules has disadvantages, particularly because it is difficult to scale the output current in large framework modules.

A method has been developed for circumventing these problems that is known in the field as "discrete power switch packaging." With this method, the current coming from the battery connection in the inverter is conducted to an intermediate circuit capacitor.

In prior assemblies, power semiconductors, i.e. semiconductor power switches in the form of high-side (HS) and low-side (LS) switches, which form half bridges, are arranged successively starting from the intermediate circuit capacitor. This means that they are not next to one another, but instead are opposite one another at their electrical contacts where the alternating current is output, such that the electrical contact for the HS switch is closer to the intermediate circuit than that for the LS switch.

This configuration has numerous disadvantages. One of these is that the electric commutation in the DC range is not symmetrical due to the different lengths of the current paths for the HS and LS switches. This asymmetry results in a large commutation cell with increased leakage inductance and poorer switching behavior in the power semiconductor.

Another disadvantage is that the length of the inverter increases with an increase in the number of parallel modules by the number of parallel modules (multiplied by the number of electrical phases). Furthermore, this serial construction of the power switch requires a certain complexity in order to take the direct current from the power source and output the alternating current to the electric machine (i.e. the electric motor). By way of example, a multi-dimensional busbar concept may be necessary, resulting in increased demands on the busbar cross section in order to accommodate the necessary current. This also means that the AC connecting bars for the phases at the ends of the inverter are extremely long and that the DC connecting bars cannot accommodate a low inductance. Furthermore, all of the modules must be cooled successively, such that the last module will have a significantly warmer cooling water temperature than at the start. This means that it cannot accommodate the same loads, because there is a lower difference in temperature between the power semiconductors and the cooling water. This can result in an artificial limitation in the overall performance of the inverter.

In an alternative assembly, proposed by the applicant, the HS and LS switches are adjacent to one another around the intermediate circuit. Their input-side electric contacts face the intermediate circuit. This results in a shorter commutation cell and low-inductance DC connecting bars. The disadvantage with this is that it results in a substantially square shape that is difficult to integrate in a normally oblong installation space.

The fundamental object of the invention is therefore to create an inverter structure with which the disadvantages described above are at least partially overcome.

This object is achieved with an inverter structure for an electronic module and the use of such an electronic module with this inverter structure in a vehicle according to the independent claims. Advantageous designs are the subject matter of the dependent claims.

An electronic module inverter structure for an electric drive in a vehicle is proposed. The inverter has at least one current phase along a first axis, also referred to simply as a phase, and a positive current connection and negative current connection for each phase at the input side (also along the first axis) for the positive and negative DC input current generated by an energy source. The phase(s) are output as an AC output current based on the DC input current, which is generated by a semiconductor bridge circuit. There is also an intermediate circuit connected in parallel to the bridge circuit (in relation to the current connection at the input side), which has at least one capacitor and at least one heat sink between the intermediate circuit and the semiconductor bridge circuit. The semiconductor bridge circuit therefore lies on the heat sink.

The semiconductor bridge circuit also has at least one half bridge for each phase, which is formed in each case by a high side switch HS and an opposing low side switch LS, connected in parallel thereto, and each of the phases is located between the opposing high side switches and low side switches and on the heat sink, and each high side switch and each low side switch is electrically connected directly to the respective phase by a first electrical contact.

In one embodiment, there are two or three, or a multiple of two or three phases, each of which has a semiconductor module. The phases, and therefore the semiconductor modules, are parallel to one another.

The inverter structure according to the invention reduces the disadvantages of the existing assemblies described above in numerous ways. By rotating the HS and LS in a phase 90°

(onto the y-axis) from their previous orientation, a matrix arrangement is obtained. As a result, the phases can be lengthened in one direction (along the first axis, the x-axis), such that the performance can be adjusted by altering the number of half bridges. In the other direction (along the second axis, the y-axis), the phases can be arranged in parallel, thus increasing the number of phases. The expansion is therefore no longer only in the longitudinal direction, or along the x-axis, when numerous semiconductors HS and LS are arranged in parallel in a module. The HS and LS switches, as well as the heat sink, can also be placed on the intermediate circuit, thus reducing the necessary installation space through this sandwich-like structure.

Furthermore, the cooling of the phases is improved as a result of the arrangement of the high side switches in relation to the low side switches, because they lie directly on the heat sink. Because of the placement of the phase(s) directly on the heat sink, i.e. no longer above the components, or DC connecting bars, the phases can be designed for stronger currents, i.e. they can be thicker, while still being cooled effectively.

In one embodiment, the heat sink is an integral unit formed beneath all of the semiconductor modules. In an alternative embodiment, the heat sink is formed by numerous parts, such that there is one heat sink for each semiconductor module. The thermal disadvantage of serial cooling for numerous phases is reduced by parallel cooling of the individual phases. With multiple heat sinks, each phase can be cooled individually. As a result, modules composed of a semiconductor module with a dedicated heat sink can be produced, one or more of which can be mounted in parallel on the intermediate circuit. This results in a modular construction.

In one embodiment, the capacitor for the intermediate circuit is monolithic. In an alternative embodiment, the capacitor for the intermediate circuit is divided into one or more capacitors for each semiconductor module, which are electrically connected to one another. In this case, there can be one capacitor housing for each phase, which also results in a modular construction. Depending on the embodiment, there can also be a single housing for each capacitor winding.

In one embodiment, each high side switch HS and each low side switch LS has a second electric contact on a side lying opposite the first electric contact for connecting to the associated input current connection.

In one embodiment, both the positive and negative input positive current connections exit on the same side of the phase, and one of the connections runs over the half bridge and the phase that comes in contact with the associated high side switch or low side switch. In an alternative embodiment, the positive and negative input positive current connections are on different sides of the phase.

In one embodiment there are at least three half bridges for each semiconductor module.

There are different types of power semiconductors in one embodiment, with a wide band gap for each HS and LS in a semiconductor module. This makes it easier to accommodate different demands on the semiconductor switch, e.g. quicker switching for just one of the semiconductor switches.

In one embodiment, each high side switch is connected to a positive contact, and each low side switch is connected to a negative contact on the intermediate circuit.

Furthermore, use of an electronic module with the inverter structure is proposed for controlling the electric drive in a vehicle equipped with an electric drive.

An electronic module is also proposed for controlling an electric drive in a vehicle, which has an inverter with one of the proposed switch assemblies or the half bridges.

An electric drive in a vehicle is also proposed, which has the electronic module for controlling the electric drive.

Furthermore, a vehicle is proposed that has an electric drive with an electronic module.

Further advantages of the invention can be derived from the following description of exemplary embodiments of the invention in reference to the drawings which illustrate details of the invention, and from the claims. The individual features can each be implemented in and of themselves or in numerous arbitrary combinations in variations of the invention.

Preferred embodiments of the invention shall be explained in greater detail below in reference to the drawings. Therein:

Identical elements or functions have the same reference symbols in the following descriptions of the drawings.

Figure 1:
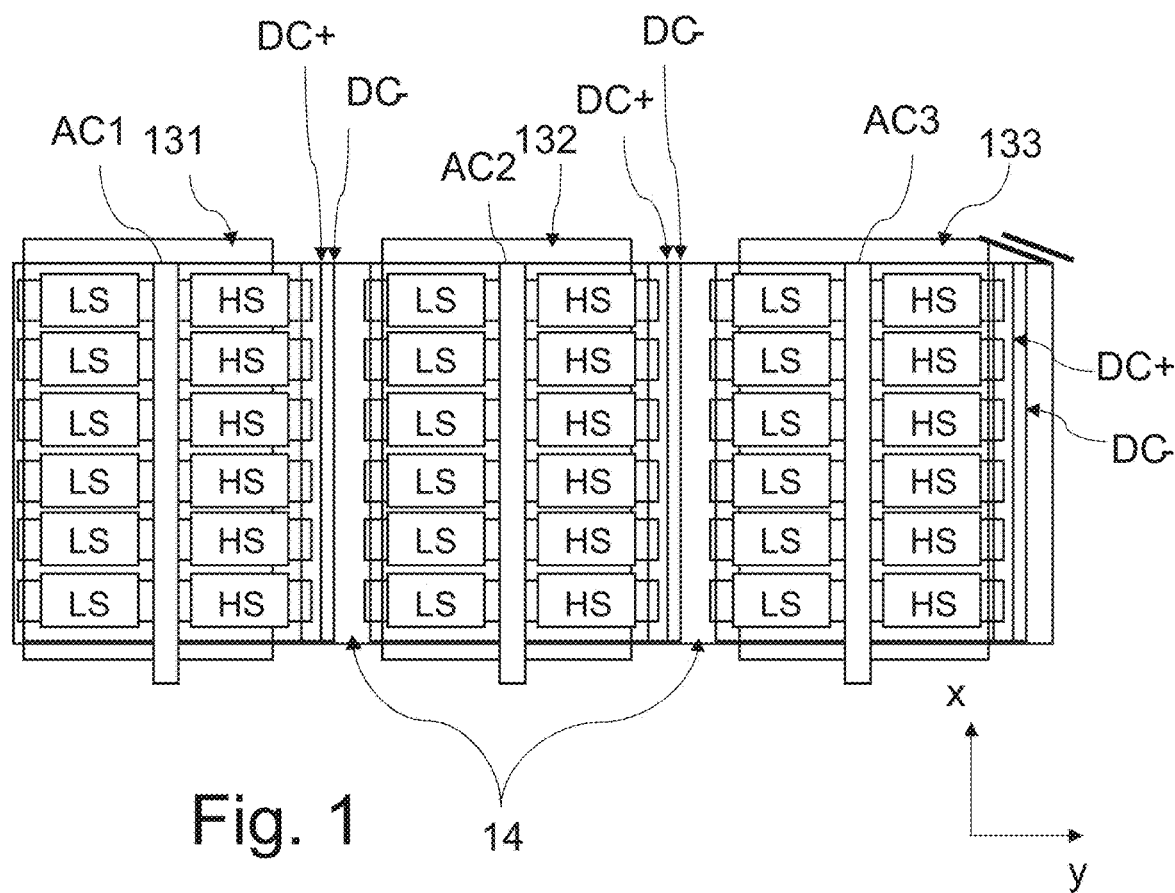
FIG. 1 shows a top view of an inverter structure that has three phases AC1-AC3, according to an embodiment of the present invention.
Figure 2:
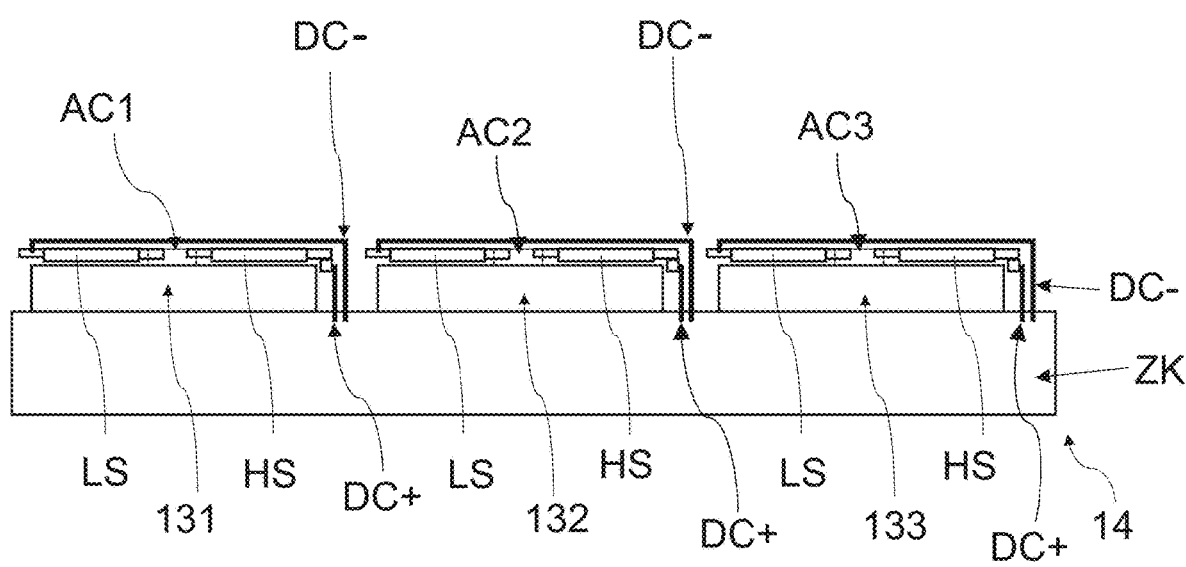
FIG. 2 shows a sectional view of the inverter structure shown in FIG. 1.

A top view of an inverter structure according to one embodiment is shown in FIG. 1. FIG. 2 shows a sectional view of the inverter structure shown in FIG. 1.

Figure 3:
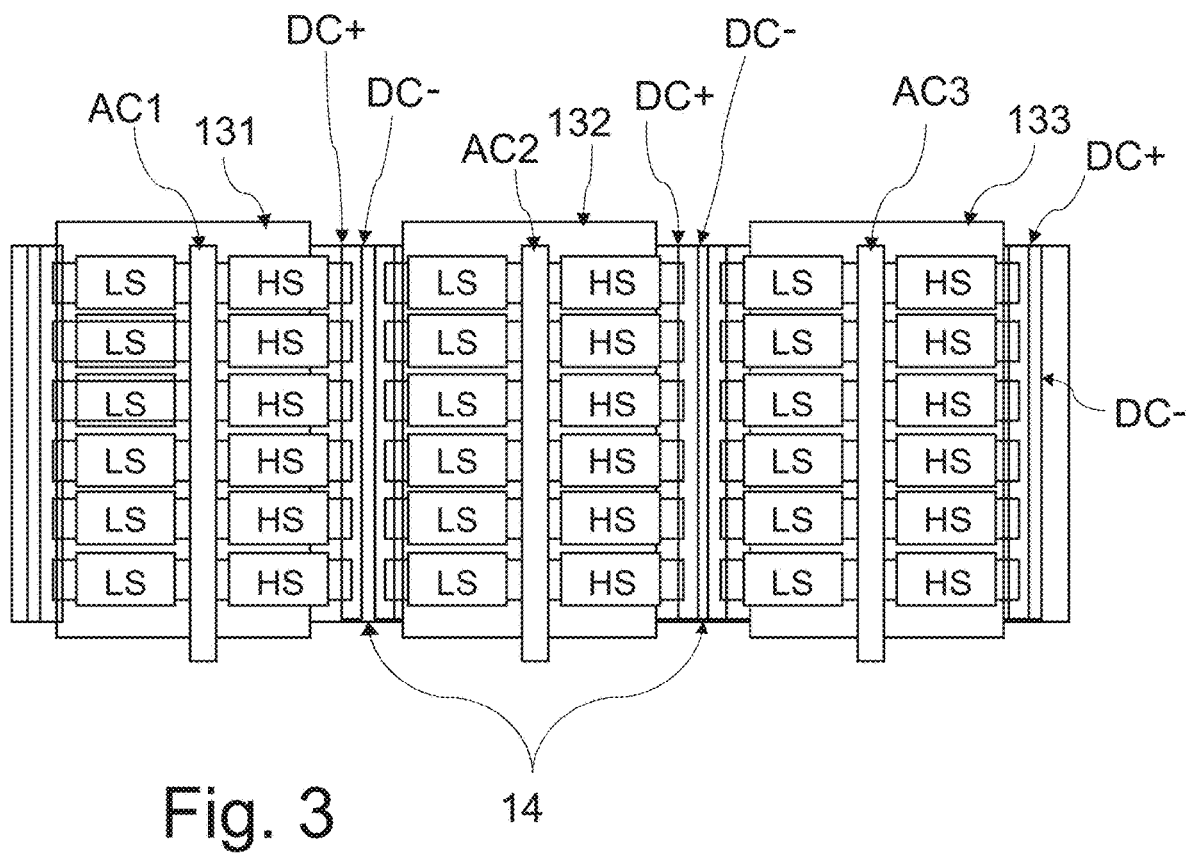
FIG. 3 shows a top view of an inverter structure that has three phases AC1-AC3, according to an alternative embodiment of the present invention.

An alternative embodiment is shown in FIG. 3, in which the input-side positive and negative connections, DC+ and DC− (DC connecting bars) are not placed on the same side of a phase AC1-AC3, but instead are placed on different sides of the phases AC1-AC3. The positive input-side connection DC+ is placed on the side with the low side switch LS, and the negative input-side connection DC− is placed on the side with the high side switch HS. This shortens the contact paths.

Figure 4:
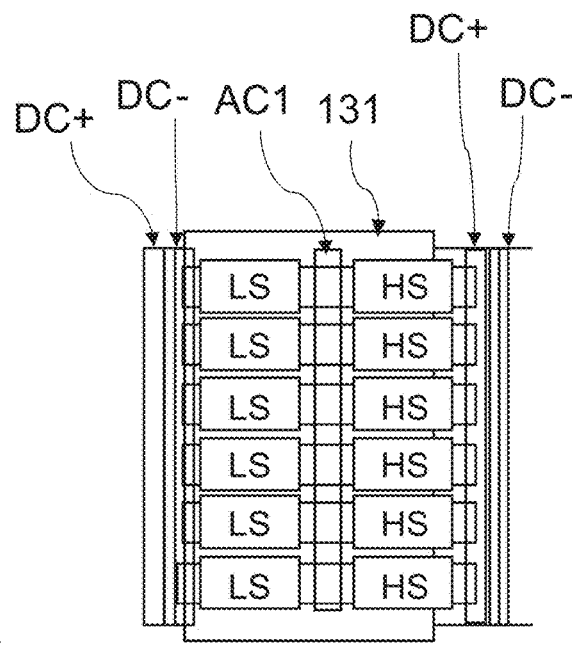
FIG. 4 shows a top view of a phase in an inverter structure with symmetrical pickups for the alternating current according to an alternative embodiment of the present invention.

An embodiment is shown in FIG. 4 in which the two symmetrical pickups are shown (as two circles on the phase, or AC connecting bar AC1). It is also possible to place a middle pickup on the phase or AC connecting bar AC1. For purposes of clarity, only one phase AC1 is shown here.

As mentioned in the introduction, numerous half bridges composed of opposing power semiconductors that can be contacted from both sides, i.e. high side switches HS or low side switches LS, are placed adjacently to one another in the previously known inverters such that the inverter has a length of the total number of phases multiplied by the number of half bridges. The phases are tapped into in the middle, between the two power semiconductors, which are in contact with one another, e.g. through soldering, and share an AC pickup that faces upward. If there were no AC connecting bar (phases AC1-AC3) the power semiconductors would be in contact with one another. Furthermore, the intermediate circuit is located next to part of the semiconductor module such that the power semiconductor that is further away from the intermediate circuit, i.e. the high side switch HS or low side switch LS, would necessarily have a longer conductor path. The disadvantage here is that the electric commutation in the DC current (input current) is asymmetrical because, e.g., the DC+ connecting bar is shorter than the DC− connecting bar, and the DC− connecting bar must then be placed over the power semiconductor.

The disadvantage here is that increasing the number of parallel modules by the number of parallel modules multiplied by the number of electrical phases increases the length along the x axis such that the AC connecting bars for the phases AC1-AC3 become extremely long at the ends of the inverter and the DC connecting bars cannot have low inductances. Although such an electronic module would be very thin, it would occupy a relatively large surface area.

Alternatively to this, it has already been proposed that power semiconductors that can be contacted electrically on both sides be placed in a series around the intermediate circuit capacitor, which results in an optimized commutation with respect to the approach described above, but has the disadvantage of a very square shape, which frequently does not fit into the available installation space.

The disadvantage with all of the known assemblies is also that all of the modules in a series are cooled successively, such that the last module is cooled with much warmer water at its input, and therefore cannot accommodate higher loads, because the difference in temperature between the semiconductor switches ant the cooling water is lower. This can result in an artificial limitation in the overall performance of the inverter.

The inverter structure according to the invention compensates for the disadvantages in the existing assemblies by increasing the length of the inverter through a matrix arrangement (resulting when there are numerous phases AC1-AC3). This is obtained through a rotation of the direction in which the parallel power semiconductors, i.e. the high side switch HS and low side switch LS, are placed, of 90° (onto the y-axis). This does not increase the number of parallel power semiconductors along the axis of the parallel phases, i.e. high side switches HS and low side switches LS, in order to increase the power output. All of the HS switches in the half bridges are preferably connected to a positive contact DC+, and all of the LS switches in the half bridges are preferably connected to a negative contact DC− in the intermediate circuit 14.

By placing the phase(s) AC1-AC3 between the high side switches HS and the low side switches LS, it is possible to obtain an even thinner structure and an effective cooling for the phases AC1-AC3, because they lie directly on the heat sinks 131-133. As a result, higher currents, e.g. 900A, can also flow over the phases AC1-AC3, without them becoming overheated. This also eliminates the need to conduct the phases AC1-AC3 (i.e. the AC busbar) through the DC connecting bar (DC+/DC−).

In particular to be able to provide higher currents, there are at least 3 half bridges for each phase AC1-AC3. Depending on the design of the high side switch HS and low side switch LS, as well as other criteria, there can advantageously be five to eight half bridges, or even more than eight half bridges, for each phase AC1-AC3. Embodiments with six half bridges for each phase AC1-AC3 are shown in the drawings.

Furthermore, the intermediate circuit capacitor 14 can be placed beneath the heat sinks 131-133, such that a sandwich-like structure is obtained. Consequently, less width (along the y-axis) is needed for each phase AC1-AC3.

The thermal disadvantages of a serial cooling are reduced through parallel cooling of the individual phases AC1-AC3, i.e. separate cooling for each phase AC1-AC3. Furthermore, by providing a separate heat sink 131-133 for each phase AC1-AC3, it is possible to accommodate the different cooling needs of the power semiconductors for the respective phases AC1-AC3 on the semiconductor module, i.e. the high side switches HS and low side switches LS. Furthermore, the necessary lengths of the conductors for the electrical phases AC1-AC3 to a collective delivery point on the machine are reduced to a minimum because the conductors for the phases AC1-AC3 are near to one another, i.e. the distance between them is approx. the same as the length of the module. In previous concepts, the distance was, e.g. 0.5× the number of parallel modules×the width of the module. By placing the pickups in the middle of, or symmetrically on, the phases AC1-AC3, a more balanced load distribution is obtained between the high side switches HS and low side switches LS, because the resistances and inductances do not increase along the phase(s) AC1-AC3 toward the pickup at the electric machine.

The high side switch HS and/or low side switch LS comprise one or more power semiconductor components, also referred to as semiconductors in the context of this application, such as IGBTs or MOSFETs. The HS switch and LS switch form a half bridge in the bridge circuit. The bridge circuit can be placed on a printed circuit board such that the power switches can be connected to a control unit, i.e. an Electronic Control Unit (ECU) in the vehicle by means of electrical contacts on the populated side of the printed circuit board for conducting electricity and/or signal transfer. The control unit is therefore able to control the power switches HS and LS for operating the electric drive, in particular for providing electricity to the electric machine in a vehicle equipped with an electric drive. The printed circuit board can be a printed circuit board (PCB) or a flexible printed circuit board.

Different embodiments of an inverter structure with phases AC1-AC3 are shown in FIGS. 1 to 3, illustrating the principle of the invention. For purposes of clarity, one phase AC1 is shown in FIG. 4. This could also just be one phase AC1; AC2; AC3 with one half bridge or two or more identical phases, e.g. a multiple of two or three, e.g. six, nine, twelve, etc. With more phases AC1-AC3 and more power, i.e. more power semiconductors for each phase AC1-AC3, the advantages of the inverter structure according to the invention become clearer.

The inverter structure shown herein has at least one half bridge for each electrical phase AC1-AC3, each of which has an HS switch that has electrical contacts on both sides, and a parallel LS switch that also has electrical contacts on both sides. For each phase AC1-AC3, the DC power supply (DC+/DC−) comes from one side (the right, in FIG. 1) for the HS and LS switch in one embodiment, such that one of the DC contacting bars must be placed above the phases AC1-AC3 (the DC supply for the low side switch LS in FIGS. 1 and 2). Alternatively, the DC power supply (DC+/DC−) takes place on the sides belonging to the HS and LS switches, i.e. the DC− supply is on the side with the low side switch LS and the DC+ supply is on the side with the high side switch HS (as can be seen in FIGS. 3 and 4). This embodiment has the advantage that the DC connecting bars do not need to be above the HS and LS switches, such that an even thinner structure can be obtained. In the latter case, there can also be an additional busbar on the outer regions of the phases AC1 and AC3, which is not connected and has a pole that is counter to the connected DC busbars, in order to reduce leakage inductance, as shown in FIGS. 3 and 4.

Depending on the power requirements, more or fewer semiconductor modules can be connected in parallel in this assembly without having a negative effect on the electrical connection of the semiconductor module. This results in an expansion of the inverter along the y-axis instead of along the x-axis, as was previously the case. It is also possible to adjust the performance without substantially impairing the electrical connection, in that there are more or fewer half bridges, i.e. high side switches HS and low side switches LS along the x-axis. The matrix arrangement according to the invention, in which the phases are arranged in parallel to one another in the first direction, along the y-axis, and the power adjustment is obtained by adjusting the number of half bridges, i.e. high side switches HS and low side switches LS, in the second direction, along the x-axis, means that there is a minimal directional dependency when altering the parameters "phases" and "power adjustment."

As a result of the discreet approach and the optimized commutation cells, different types of semiconductors can be used in an inverter with this inverter structure. The types of semiconductors that are selected are advantageously those that allow for active switching and have a wide band gap, e.g. Si-IGBTs, SiC-MOSFETs, SiC-cascodes, GaN. This means that not only different power semiconductors can be used in the inverter structure, but also different types of semiconductors can be used simultaneously in the inverter structure as well, i.e. inside each semiconductor module.

The heat sinks 131-133 are used to dissipate the heat generated by the power semiconductors, i.e. the HS and LS switches, and the phase(s) AC1-AC3 in the inverter. There is advantageously one heat sink 131-133 for each semiconductor module, such that each phase AC1-AC3 has its own heat sink 131-133 and therefore its own cooling branch. This means that the cooling can be adjusted to the components in each semiconductor module, i.e. each module has a dedicated cooling region. This also results in a modular structure in which a semiconductor module can have a dedicated heat sink 131-133, thus forming a single module, numerous of which modules can be connected in parallel, i.e. one for each phase AC1-AC3, in a simple manner, as shown in the drawings. The cooling branches of the heat sinks 131-133, of which there is one for each electrical phase AC1-AC3, can either be separate structures, or they can be joined outside of the DC busbars.

Although a constant DC voltage is desirable, the DC voltage may exhibit voltage ripples caused by parasitic effects. The electronic module has an intermediate circuit 14 to counteract this, which contains an intermediate circuit capacitor. The intermediate circuit capacitor can be monolithic, as shown in FIGS. 1 and 2. Alternatively, it can have different discretization steps, comprising up to as many as one housing for each winding.

The connection between the bridge circuit and the printed circuit board and/or the connection between the printed circuit board and the heat sink is preferably obtained by an adhesive, screws, welding, plug-in connections, and/or clamps.

An electronic module in the framework of this invention is used for operating an electric drive in a vehicle, in particular an electric vehicle and/or hybrid vehicle. The electronic module comprises a DC/AC inverter that has the inverter structure described herein, or a part thereof. The electronic module can also comprise an AC/DC rectifier, a DC/DC converter, a transformer, and/or some other converter, or a part of such a converter, or a combination of these. In particular, the electronic module is used to provide electricity to an electric machine, e.g. an electric motor and/or generator. A DC/AC inverter is preferably used to generate a multi-phase alternating current from a direct current generated by a DC voltage from an energy source such as a battery.

Inverters for electric drives in vehicles, in particular passenger automobiles and commercial vehicles, including busses, are designed for the high voltage range, and are designed in particular for use in a reverse voltage range starting at ca. 650 volts.

LIST OF REFERENCE SYMBOLS

14 intermediate circuit
131-133 heat sink
AC1-AC3 AC phases/output-side connections
DC+/DC− DC input current
HS high side switch
LS low side switch

The invention claimed is:

1. An inverter structure in an electronic module for an electric drive in a vehicle, comprising:
   at least one phase bar, wherein a first phase bar of the at least one phase bar corresponds to a first phase, and wherein the first phase bar extends along a first axis;
   an input-side positive current connection and an input-side negative current connection for each phase bar of the at least one phase bar for a DC input current, wherein the at least one phase bar is configured to output an AC output current generated from the DC input current;
   a semiconductor bridge circuit configured to generate the AC output current;
   an intermediate circuit that has at least one capacitor, connected in parallel to the bridge circuit;
   at least one heat sink between the intermediate circuit and the semiconductor bridge circuit, the at least one heat sink comprising a first planar surface and a second planar surface on an opposite side of the at least one heat sink from the first planar surface, wherein the first planar surface contacts the intermediate circuit, without an intervening electronic device, to cool the intermediate circuit, and wherein the second planar surface contacts the semiconductor bridge circuit, without an intervening electronic device, to cool the semiconductor bridge circuit, wherein
   the bridge circuit contains, for each phase bar of the at least one phase bar:
     at least one half bridge, formed by a high side switch and an opposing low side switch connected in parallel thereto, and wherein
     each phase bar of the at least one phase bar contacts the second planar surface of the at least one heat sink to be cooled by the heat sink, and wherein a first high side switch that is directly electrically connected to the first phase bar is located on a first side of the first axis, and wherein a low side switch that is directly electrically connected to the first phase bar is located on a second side of the first axis opposite the first side of the first axis.

2. The inverter structure according to claim 1, wherein the at least phase comprises a plurality of phases comprising two or three, or a multiple of two or three phases, wherein each phase has a semiconductor module, which are parallel to one another.

3. The inverter structure according to claim 2, wherein:
   the at least one heat sink forms an integral unit, and is placed beneath all of the semiconductor modules, or
   the at least one heat sink comprises a plurality of heat sinks that are separate units, such that there is one heat sink for each semiconductor module.

4. The inverter structure according to claim 2, wherein the capacitor in the intermediate circuit is monolithic, or is divided into one or more capacitors for each semiconductor module, which are electrically connected to one another.

5. The inverter structure according to claim 2, wherein there are at least three half bridges for each semiconductor module.

6. The inverter structure according to claim 5, wherein there are different types of power semiconductors with wide band gaps for each high side switch and each low side switch in a semiconductor module.

7. The inverter structure according to claim 2, wherein each high side switch and each low side switch has an electrical contact connection on a side lying opposite the respective phase bar, configured to contact an associated input-side current connection.

8. The inverter structure according to claim 2, wherein the positive and negative input-side positive current connections are each located on different sides of the at least one phase bar.

9. The inverter structure according to claim 2, wherein both the positive and negative input-side current connections come from the same side of the at least one phase bar coming from the intermediate circuit, and one of the positive or negative input-side current connections is located above the half bridge and the phase bar to contact the high side switch or the low side switch.

10. The inverter structure according to claim 2, wherein each high side switch is connected to a positive contact, and each low side switch is connected to a negative contact in the intermediate circuit.

11. The inverter structure according to claim 1, wherein each high side switch and each low side switch has an electrical contact connection on a side lying opposite the respective phase bar, configured to contact an associated input-side current connection.

12. The inverter structure according to claim 1, wherein both the positive and negative input-side current connections come from the same side of the at least one phase bar coming from the intermediate circuit, and one of the positive or negative input-side current connections is located above the half bridge and the phase bar to contact the high side switch or the low side switch.

13. The inverter structure according to claim 1, wherein each high side switch is connected to a positive contact, and each low side switch is connected to a negative contact in the intermediate circuit.

14. Use of an electronic module that has the inverter structure according to claim 1 for controlling the electric drive in a vehicle equipped with an electric drive.

15. An electronic module for controlling an electric drive in a vehicle, comprising:
the inverter structure according to claim 1.

16. An electric drive for a vehicle, comprising:
the electronic module according to claim 15 for controlling the electric drive.

17. A vehicle, comprising:
an electric drive containing the electronic module according to claim 11.

18. The inverter structure according to claim 1, wherein the positive and negative input-side positive current connections are each located on different sides of the at least one phase bar.

* * * * *